United States Patent [19]
Kakizaki et al.

[11] Patent Number: 4,623,320
[45] Date of Patent: Nov. 18, 1986

[54] FLYWHEEL CONTROLLED TOY

[75] Inventors: Katsumi Kakizaki; Yutaka Ajiro, both of Tokyo, Japan

[73] Assignee: Tomy Kogyo Co. Inc., Tokyo, Japan

[21] Appl. No.: 664,567

[22] Filed: Oct. 25, 1984

[30] Foreign Application Priority Data

Oct. 27, 1983 [JP] Japan .......................... 58-165421[U]

[51] Int. Cl.$^4$ ........................................... A63H 29/22
[52] U.S. Cl. .................................... 446/462; 74/572; 446/290; 446/308; 446/435; 446/456
[58] Field of Search ............... 446/175, 308, 435, 436, 446/437, 441, 443, 454, 455, 456, 460, 462, 290, 291; 74/142, 572

[56] References Cited

U.S. PATENT DOCUMENTS

| | | | |
|---|---|---|---|
| 2,279,386 | 4/1942 | Carver | 446/435 X |
| 3,151,866 | 10/1964 | Glass et al. | 446/291 |
| 3,386,406 | 6/1968 | Tsunoda | 446/460 |
| 3,398,480 | 8/1968 | Tsunoda | |
| 4,086,724 | 5/1978 | McCaslin | |
| 4,165,581 | 8/1979 | Wolf | 446/175 |

Primary Examiner—F. Barry Shay
Attorney, Agent, or Firm—K. H. Boswell

[57] ABSTRACT

A moveable toy which includes a motor for producing motion. Associated with the motor is a motor controller for accelerating and deaccelerating the motor. A rotary element is driven by the motor. Associated with the rotary element is a flywheel which is capable of being rotated by the rotary element, but is also capable of independent rotation. The flywheel is further associated with a switch which governs the output of the motor to several moving elements located on the toy. The flywheel interacts with the switch to shift the output to the individual moving elements each time the speed of the flywheel differs from that of the rotating element. The motor controller deaccelerates the motor which in turn deaccelerates the rotating element upon command of the operator of the toy.

5 Claims, 13 Drawing Figures

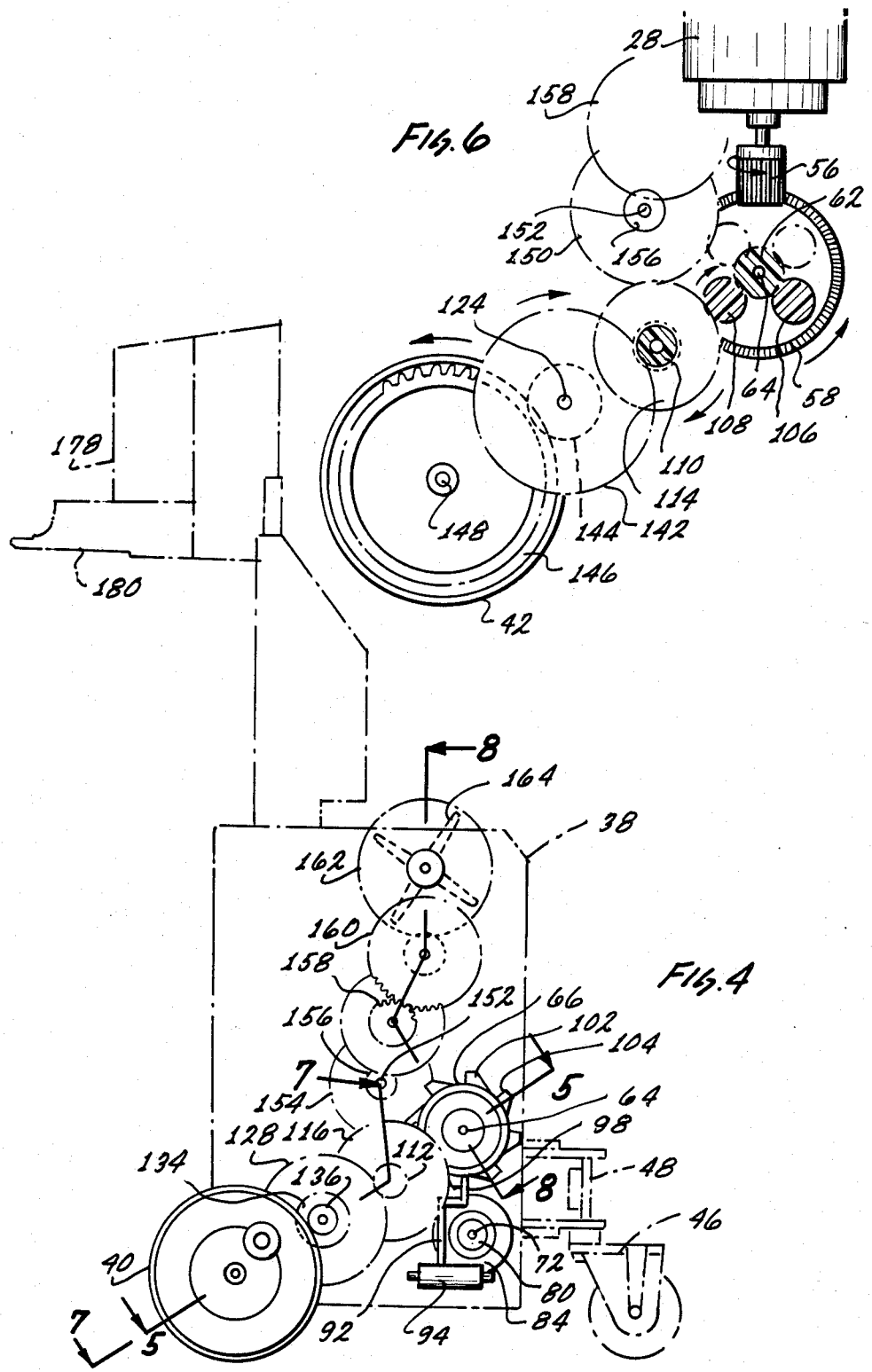

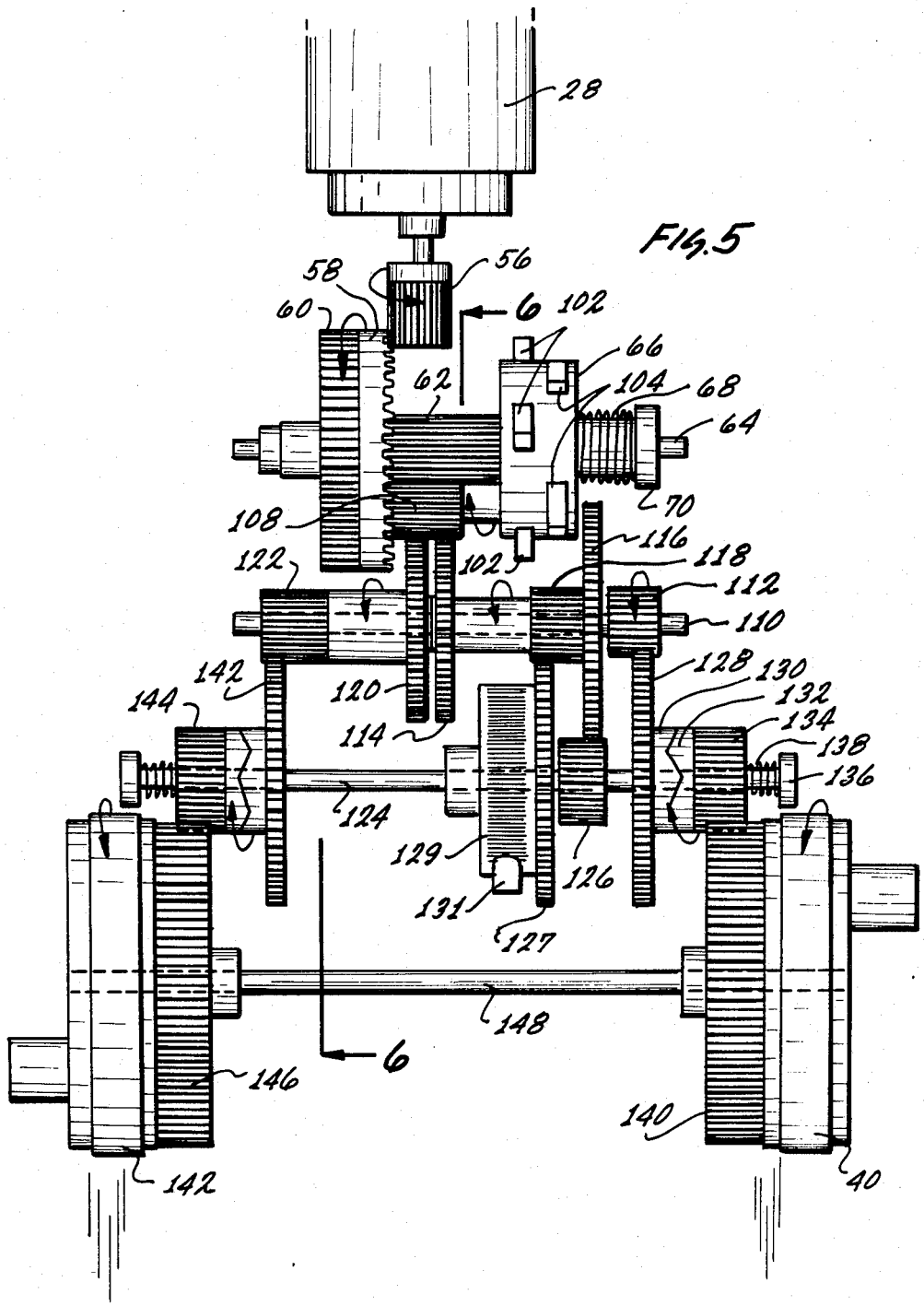

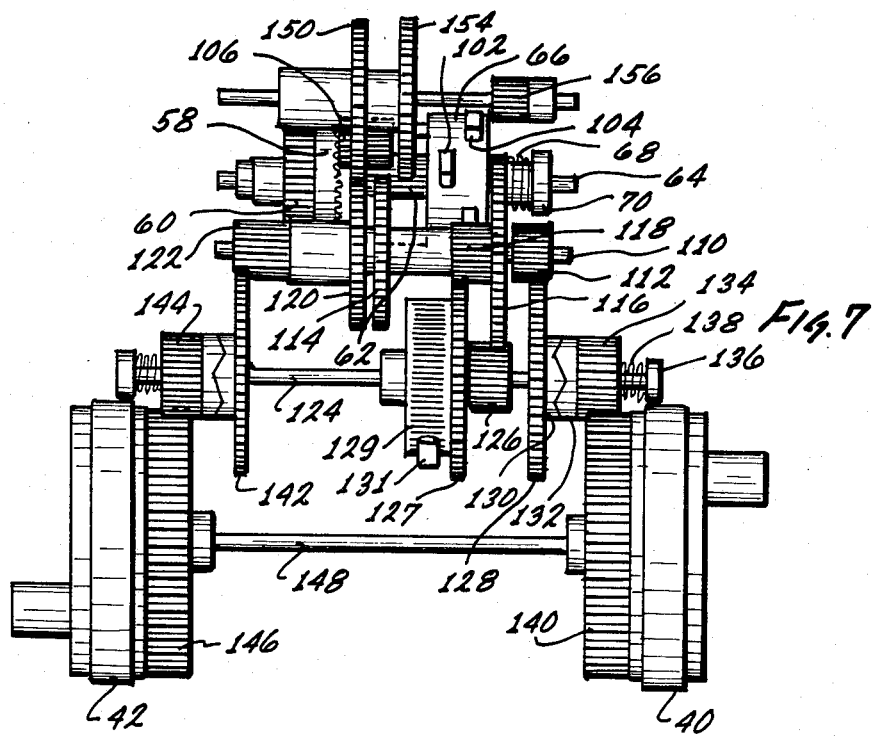
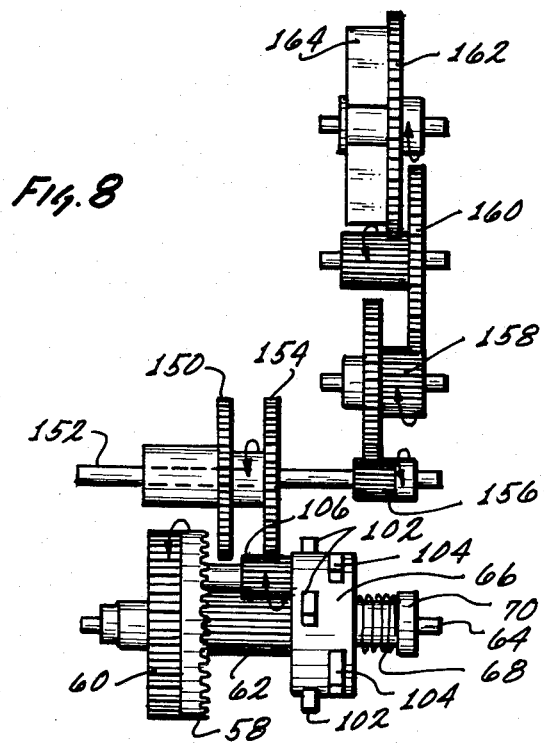

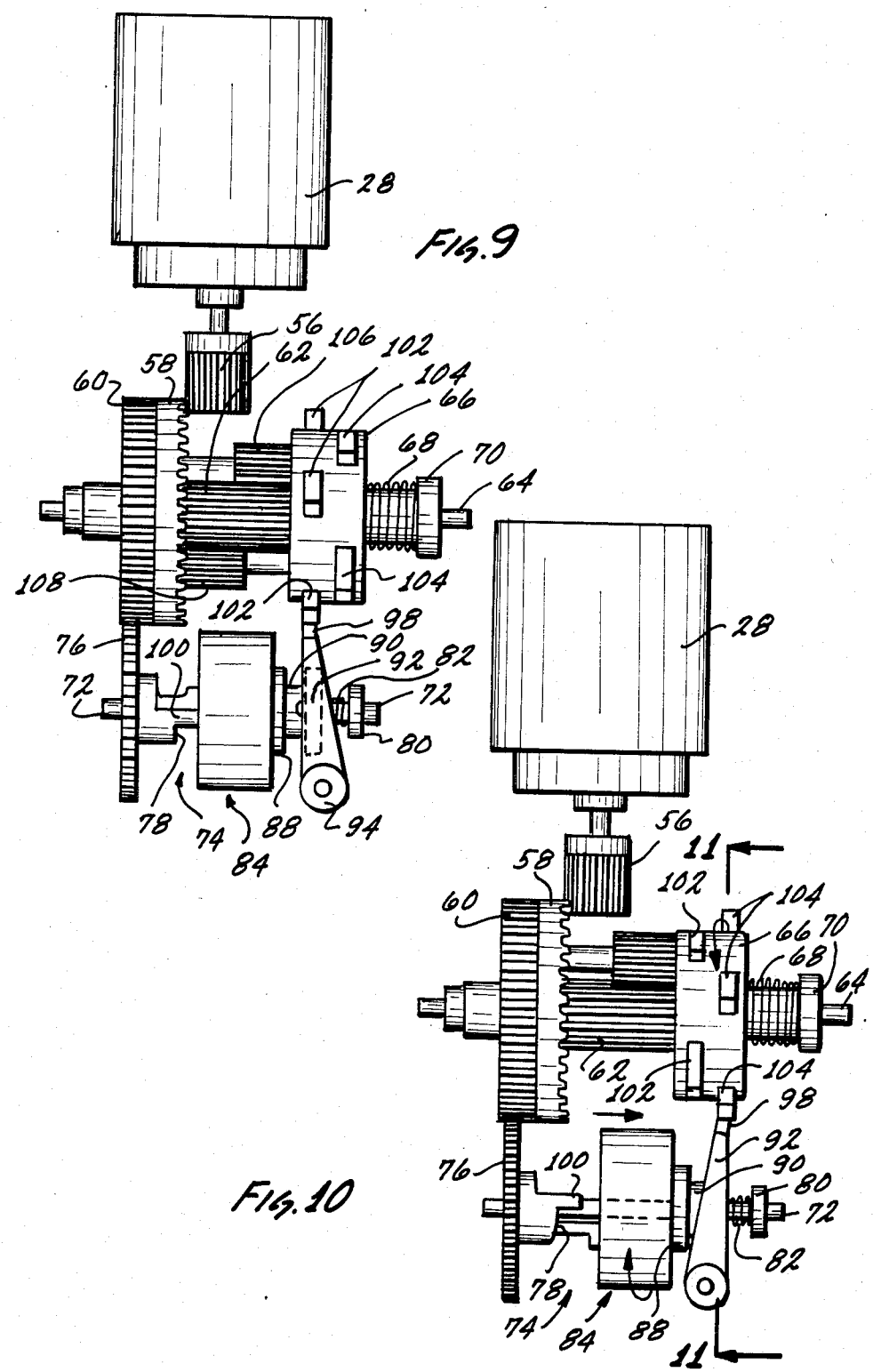

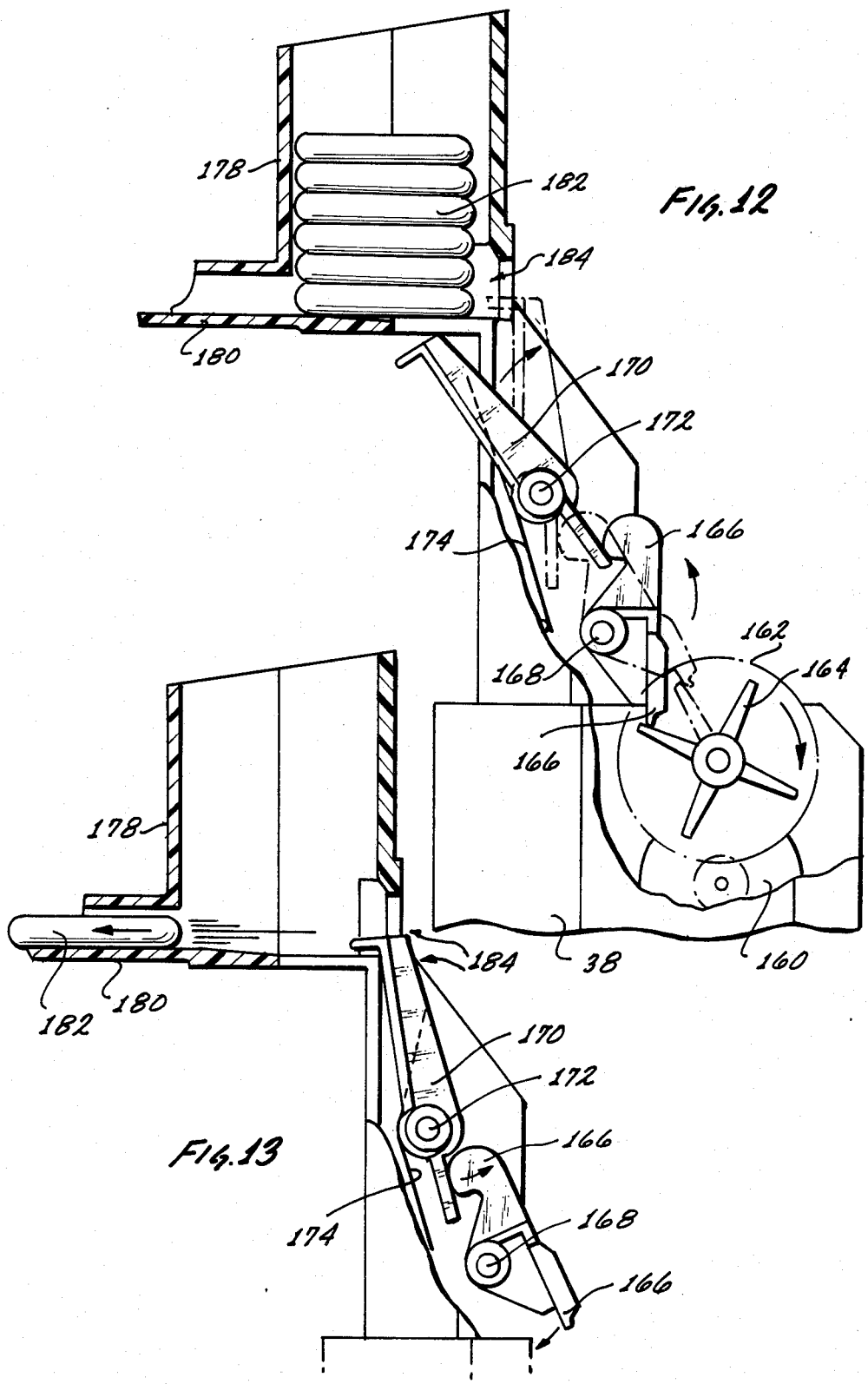

FLYWHEEL CONTROLLED TOY

CROSS REFERENCE TO RELATED APPLICATIONS

This application is related to my application entitled Remote Controlled Toy Utilizing Piezoelectric Element, Ser. No. 664,597, which is being concurrently filed with this application on Oct. 25, 1984. The entire contents of my concurrently filed application entitled Remote Controlled Toy Utilizing Piezoelectric Element, is herein incorporated by reference.

BACKGROUND OF INVENTION

This application is directed to a toy which utilizes a flywheel which is rotated by a motor of the toy. The flywheel is capable of shifting a means within the toy between a variety of positions so as to transfer rotation of the motor to a variety of elements on the toy for action of these elements.

A variety of wheeled toys are known. These can range from the simple to the complex. In the more complex of these, remote control is utilized for handsoff operation of the toy. The simplest remote control systems allow for two functions, on or off, under the remote control. By utilizing multiple channel remote control or by modulating the transmitted signal, more sophisticated toy actions can be accomplished. Unfortunately, both the transmitters and receivers of these toys also become quite complicated in order to perform these functions and, as a result thereof, the cost of the toy is increased.

In order to skirt the above noted problem, certain single channel radio controlled toys have been combined with mechanical shifting mechanisms in an attempt to achieve complex vehicle control without having to resort to use of multiple frequency transmitters and receivers. In one of these systems, a mechanical reversing switch switches the polarity of the current fed to a motor in order to reverse the same. In a further of these systems, a mechanical switch is activated upon receipt of a signal. The mechanical switch includes a cam which is rotated. For a portion of a rotation, the cam keeps the switch closed to complete an electrical circuit. While these toys are certainly utilitarian in nature and have considerable play value, they, too, are limited simply to a forward or backward motion with regard to the switch, or to the presence or absence of a motion with respect to the cam.

BRIEF DESCRIPTION OF THE INVENTION

Even in view of the above noted remote controlled toys, it is considered that there exists a need for a toy which is capable of performing a multiplicity of actions, yet still utilizes a very simple transmitter receiver system for the toy. It is a broad object of this invention to fulfill this need. It is a further object of this invention to provide for a toy which utilizes a very simple mechanism in order to shift between different outputs for the toy. Additionally, it is the object of this invention to provide for a toy, which because of it's simplicity, yet in view of the engineering principles incorporated therein, is capable of a long and useful lifetime, and can be made conveniently available to the consuming public.

These, and other objects, as will become evident in the remainder of this specification, are achieved in a toy which comprises: a housing; motor means mounted on said housing, said motor means for outputing motion; motor control means mounted on said housing in operative association with said motor means, said motor control means for controlling said motor by accelerating and deaccelerating said motor means; a flywheel means rotatably mounted on said housing; motion transfer means located on said housing in operative association with said flywheel means and said motor means, said motion transfer means for transferring motion of said motor means to said flywheel means whereby said flywheel means can be rotated by said motor means; switch means located on said housing in operative associated with said flywheel means, said switch means having at least a first position and a second position, said flywheel means switching said switch means between said switch positions in response one of acceleration and deacceleration of said motor with respect to said flywheel means; output means mounted on said housing in operative association with said motor means whereby said motor means drives said output means, said output means capable of outputing at least two independent outputs, said output means further operatively associated with said switch means whereby said output means outputs one of its outputs in response to said switch means being in one of its respective positions and said output means outputs a further of its outputs in response to said switch means being a further of its respective positions.

Further, these objects are achieved in a remote control toy including a remote radio transmitter for transmitting radio signals, the improvement which comprises: a housing; a radio receiver located on said housing, said radio receiver for receipt of radio signals; an electric motor located on said housing; an electric power supply located on said housing, said electric power supply connected to said motor supplying power to said motor; said radio receiver including a control means, said control means operatively associated with said power supply, said control means for controlling the electric power supplied to said motor whereby when no radio signal is received by said radio receiver, power is supplied to said motor, and when a radio signal is received by said radio receiver, power supply to said motor is interrupted; a further means operatively connected to said motor so as to receive output from said motor, said further means including a member positionable in a plurality of positions, said member moving between said positions in response to interruption of power to said motor.

Additionally, these objects can be achieved in a remote control toy, including a remote radio transmitter for transmitting radio signals the improvement which comprises: a housing; a motor means located on said housing, said motor means for producing a rotational output; a radio receiver means mounted on said housing, said radio receiver means for receiving a transmitted radio signal, said radio receiver means including motor control means for controlling said motor by changing the speed of rotation of said motor; flywheel means located on said housing in operative association with said motor; governing means associated with said motor and said flywheel means, said governing means for transmitting motion from said motor to flywheel for rotation of said flywheel, and further, for sensing when the rotational speed of said flywheel means differs from the rotational speed of said motor means in response to changes of speed of said motor means.

In the illustrative embodiment, a flywheel which is moveable axially along a shaft interacts with a rotating element. The movement of the flywheel axially along the shaft causes a switch member to move between two positions allowing for shifting of a simple shift mechanism between a plurality of positions responding to different outputs for the toy.

BRIEF DESCRIPTION OF THE DRAWINGS

This invention will be better understood when taken in conjunction with the drawings wherein:

FIG. 4 is a side elevational view about the line 4—4 of FIG. 3;

FIG. 5 is a view about the line 5—5 of FIG. 4;

FIG. 6 is a view about the line 6—6 of FIG. 5;

FIG. 7 is a view about the line 7—7 of FIG. 4;

FIG. 8 is a view about the line 8—8 of FIG. 4;

FIG. 9 is a front elevational view of certain of the components located in the central portion of FIG. 4 showing these components in a first spacial relationship;

FIG. 10 is a view similar to FIG. 9, except certain of the components are seen in an additional spacial configuration;

FIG. 12 is a side elevational view of a partial section of certain of the components seen in the upper portion of FIG. 3, and;

FIG. 13 is a view similar to FIG. 12, except showing certain other components in a different spacial relationship than that seen in FIG. 12.

Figure 1:
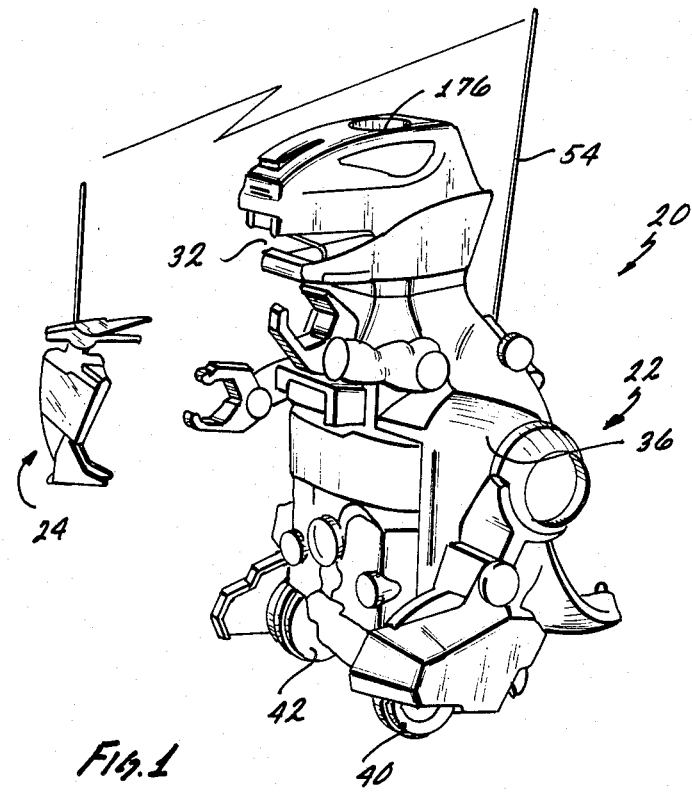
FIG. 1 is an isometric view of a remote control and a transmitter unit utilized in conjunction with the toy.

The invention described in this specification and shown in the drawings utilizes certain principles and/or concepts as are set forth in the claims appended to this specification. Those skilled in the toy arts will realize that these principles and/or concepts are capable of being utilized in a variety of embodiments which may differ from the exact embodiment utilized for illustrative purposes herein. For this region, this invention is not to be construed as being limited solely to the illustrative embodiment but is only to be construed in view of the claims.

DETAILED DESCRIPTION OF THE INVENTION

In FIG. 1 there is shown a remote control toy 20. It is comprised of two component parts. The first component part is the main housing 22, and the second component part is a remote or transmitter housing 24. The transmitter housing 24 is capable of transmitting a radio frequency signal to the main housing 22 with receipt of this signal by a radio receiver located within the main housing 22.

In my co-pending application entitled Remote Controlled Toy Utilizing Piezoelectric Element, Ser. No. 664,597, filed concurrently on Oct. 25, 1984 with this application, I discuss the radio frequency transmitter 24 as well as the radio receiver which is located within the main housing 22, and how these two components operate and function with respect to one another. In view of brevity of this specification, the entire contents of my application entitled Remote Controlled Toy Utilizing Piezoelectric Element, Ser. No. 664,597, are herein incorporated by reference. For the sake of this application, it is sufficient to state that the transmitter housing 24 is capable of transmitting a radio frequency signal and the same can be received by the main housing 22.

Figure 2:
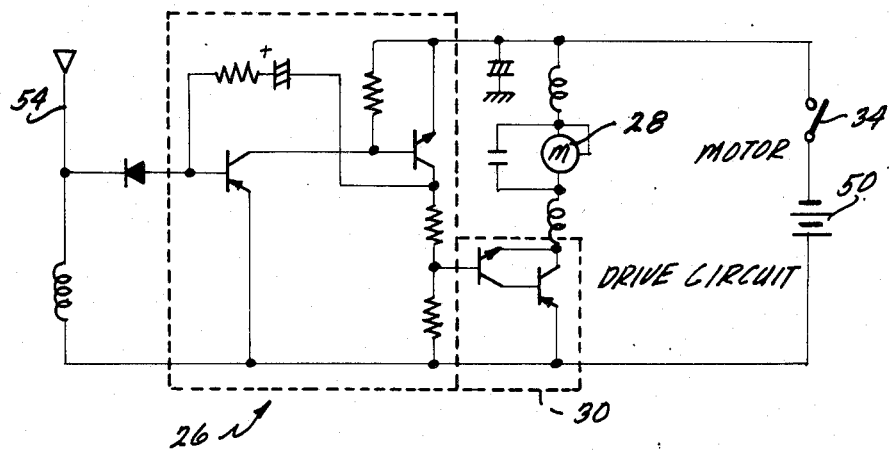
FIG. 2 is an electrical schematic of a receiver unit located within the large component shown in FIG. 1.

In FIG. 2 of the drawings, I show an electrical schematic of the radio receiver 26 that includes therein a motor 28 which is located within the main housing 22. The radio receiver 26 includes a control or motor switch means 30 which is utilized to control operation of the motor 28 in response to receipt of a radio signal by the radio receiver 26. Details of construction and a detailed discussion of this circuit is set forth in my application entitled Remote Controlled Toy Utilizing Piezoelectric Element.

For the purposes of this specification, it is sufficient to note that upon receipt of a transmitted radio signal by the radio receiver 26, the motor switch 30 stops the supply of power of the motor 28, and upon termination of the transmission of the radio signal, and lack of receipt thereof by the radio receiver 26, the motor 28 is once again supplied power by the switch 30. As is discussed in my application entitled Remote Controlled Toy Utilizing Piezoelectric Element, the transmitted radio signal received by the radio receiver 26 is of a brief nature and, as such, power to the motor 28 is only momentarily stopped before it is once again re-supplied by the switch 30 upon loss of the radio frequency signal. This serves to simply temporarily deaccelerate the motor in response to receipt of the radio signal followed by acceleration of the motor 28 upon discontinuance of receipt of the signal. The motor 28, in fact, may not completely stop rotating because of the rotational momentum of the motor armature and other rotation parts.

Prior to discussing the mechanical components of the toy 20, a brief discussion with regard to operation of the same will facilitate understanding of the invention. The toy 20 is capable of executing several different independent movements or modes. These include moving in a forward direction, turning, stopping, and projecting projectiles, hereinafter identified, from the mouth 32 of the main housing 22. To operate the toy 20, the user of the same moves an electrical switch 34 from the off position to the on position. As with the motor 28, the electrical switch is identified by the numeral 34 with regard to both the mechanical component seen in FIG. 3 and the electronic signal seen in FIG. 2. In any event, once the toy 20 is turned to the on position, the motor 28 is energized and is rotated. Depending on the particular mode the toy 20 is in, the toy 20 will proceed to move forward, to turn, to stop, or to eject the projectiles out of its mouth 32.

Each time the user of the toy 20 transmits a signal from the remote housing 24, as is described in my application entitled Remote Controlled Toy Utilizing Piezoelectric Element, the toy 20 ceases doing it's current mode of operation and proceeds to operate in a further mode of operation. As such, if the main housing 22 of the toy 20 was moving forward, and the radio signal was transmitted to the main housing 22 by the remote housing 24, the toy 20 will then cease forward movement and proceed to execute one of the other modes of operation, i.e., turning, stopping, or ejecting projectiles. Upon each subsequent transmission of a radio signal by the remote housing 24, the current mode of operation is halted and a further mode of operation is initiated.

As is evident from the above discussion, and from the discussion in my application entitled Remote Controlled Toy Utilizing Piezoelectric Element, the main housing 22 is capable of executing at least four (4) modes of operation under the control of only a single radio frequency transmission. This allows for a very complex operation of the main housing 22 without having to resort to sophisticated electronic transmitters and receivers.

Figure 3:
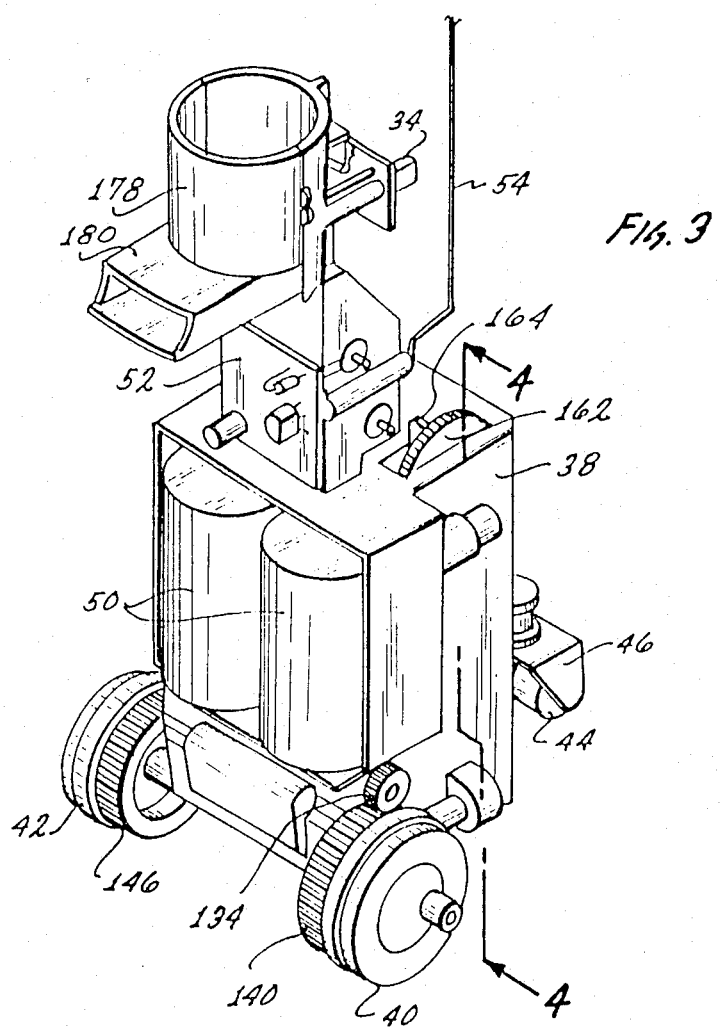
FIG. 3 is an isometric view of the larger component seen in FIG. 1 with certain external housing members removed for clarity of internal parts.

The main housing 22 includes an outside shell 36 which serves as a covering of certain internal components which are best seen in FIG. 3. As is shown in FIG. 3, an internal housing 38 includes a left drive wheel 40, a right drive wheel 42, and a further following wheel 44. As so constructed, the main housing 22 is, thus, supported on the three wheels 40, 42, and 44.

As is seen in FIG. 4, the rear or following wheel 44 is mounted to an appropriate bracket 46 which is suspended by an axle 48 from the rear of the internal housing 38. The bracket 46 is free to rotate about the axle 48, thus allowing the rear or following wheel 44 to follow the movements of the drive wheels 40 and 42.

As hereinafter explained, in the forward modes, the drive wheels 40 and 42 are capable of rotating forward in unison to move the main housing 22 forward. And in the turning mode, the wheels 40 and 42 rotate in opposite directions so as to rotate the main housing 22. In the stop and projecting modes, both wheels 40 and 42, are stopped.

Referring again to FIG. 3, the internal housing 38 carries two batteries collectively identified by the numeral 50 for providing power for the main housing 22. Located just above the batteries 50, is a circuit board 52 which carries the electronic components making up the radio receiver 26 and the switch 30. An antenna 54 projects upwardly and out of the shell 36 so as to be exposed outside of the main housing 22.

There are several gear trains within the main housing 22 which are ultimately driven by the motor 28 and are utilized to drive other components during the different modes of operation or outputs of the toy 20. Motion is transferred from the motor 28 via certain components which are best seen in FIGS. 5, 6, 9, and 10, constituting both a governing means for outputting of motion to these components, and a motion transferring means for transferring motion of the motor 28 to these components or systems.

The motor 28 has an output shaft having a drive pinon 56 located thereon. As was noted previously, the motor 28 is normally in an on position when the off/on switch 34 is switched on and the motor 28 is briefly switched to the off position upon receipt of a radio frequency signal. In view of this, it is only necessary for the motor 28 to be a simple motor which is capable of being either on or off, and does not require reversing of direction of rotation of the motor as is required in other remote control toys.

the drive pinon 56 meshes with a crown gear 58. The crown gear 58 is integrally formed with a large spur gear 60 and an elongated sun gear 62. All of these rotate in unison on a shaft 64 which is appropriately mounted to the internal housing 38. Independently mounted on the shaft 64 is a positioning drum 66. A compression spring 68 is positioned between the positioning drum 66 and a bushing 70. This urges the positioning drum 66 against the end of the sun gear 62. This forms a frictional engagement of the positioning drum 66 with the end of the sun gear 62 such that the positioning drum 66 will rotate in conjunction with the sun gear 62 if nothing impedes its rotation, but will easily slip against the end of the sun gear 62 if, in fact, its rotation is impeded.

As is seen in FIG. 6, the crown gear 58 is rotated counterclockwise by the drive pinon 56. When motion is communicated to the positioning drum 66, this motion is therefore also counterclockwise as seen in FIG. 8, and, as seen in FIGS. 5, 9, and 10, results in motion of the positioning drum 66 moving from the top toward the observer and then downward.

Figure 11:
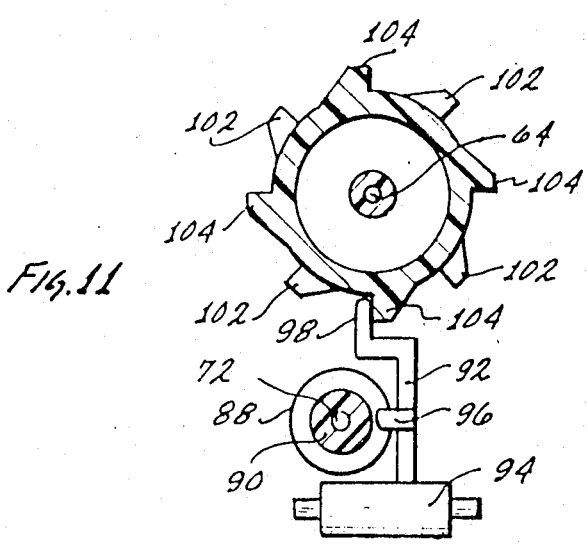
FIG. 11 is a side elevational view about the line 11—11 of FIG. 10.

A further shaft 72, as can be seen in FIG. 11, is located parallel to and slightly below the shaft 64. A rotating element 74 composed of a spur gear 76 and a helical surface 78, are fixed to the shaft 72. Also fixed to the shaft 72 at the opposite end of the spur gear 76, is a bushing 80. A compression spring 82 is placed around the shaft 72 adjacent to the bushing 80. Inbetween the rotating element 74 and the compression spring 82 on the shaft 72 is a flywheel 84. The flywheel 84 is not connected to the shaft 72 but can rotate independent of it. The flywheel 84 includes a small extension or member 86 which projects from the left of the flywheel 84. This flywheel extension or member 86 can interact with the helical surface 78 and, together, the helical surface 78 and the flywheel extension 86 form a connecting means between the spur gear 76 and the flywheel 84.

On the right hand side of the flywheel 84, and formed as an integral part of the flywheel 84, is an extension 88 that includes a circumferentially extending channel 90. A switching member 92 has an axle portion 94 which is pivoted to the internal housing 38. It further includes a small projection 96 which is positioned so to fit with the channel 90 on the extension 88 of the flywheel 84. The end 98 of the switching member 92 is positioned adjacent to the positioning drum 66.

The flywheel 84, including its bushing extension 88, is free to slide along the shaft 72 axially. In FIG. 9, the flywheel member 86 is located adjacent to the spur gear 76 on the helical surface 78. If the flywheel 84 rotates faster than does the spur gear 86, the flywheel member 86 will ride along the helical surface 78 away from the spur gear 76, to the position seen in FIG. 10. This does two things. One of them is compression of the spring 88 and the second is movement of the end 98 of the switching member 92 from the position seen in FIG. 9 to the position seen in FIG. 10.

If the spur gear 76 moves at a slightly faster speed than does the flywheel 84, the bias created in the compression spring 82 will slide the flywheel 84 to the left to once again position the flywheel member 86 at the lowest point along the helical surface 78. When this happens, a small projection 100, formed on the helical surface 78, interlocks with the flywheel member 86 so as to rotate the flywheel 84 at the same speed as the speed of rotation of the spur gear 76. It is evident that the flywheel 84 can rotate through a partial rotation at a different speed than the spur gear 76. Any rotation, however, between these two components at different speeds will cause movement of the flywheel 84 to the right or to the left along the shaft 72 depending on which of the components is rotating faster than the other.

The positioning drum 66 includes positioning elements identified in the figures as two groups of numbers, elements 102 and 104. The elements 102 are on the left hand side of the positioning drum 66 whereas the elements 104 are on the right hand side. The elements 102 and 104 are, thus, axially displaced with respect to the shaft 64 from one another, and further, an element 102 is circumferentially displaced with respect to the two elements 104, both clockwise and counterclockwise from it along the circumferential surface of the positioning drum 66, and visa versa for the elements 104.

Interaction of the end 98 of the switching member 92 with one of the positioning elements 102 or 104 impedes any rotation of the positioning drum 66 resulting from frictional engagement of the positioning drum 66 with the sun gear 62. If the switching member 92 is moved from the position seen in FIG. 9, to the position seen in FIG. 10, by movement of the flywheel 84 axially along the shaft 72, it is released from one of the positioning elements 102 as it moves to the right and, thus, the positioning drum 66 can be frictionally rotated by the sun gear 62 a small increment, until a positioning element 104 on the right of the positioning drum 66 then catches against the end 98 of the switching member 92. This then fixes the positioning drum 66 against further rotation. If the flywheel 84 then is allowed to slide axially along the shaft 72 to the left, the end 98 of the switching member 92 is released from the positioning element 104, that is, it moves from the position seen in FIG. 10 to that of FIG. 9, allowing for further frictional rotation of the positioning drum 66 by the sun gear 62 until the next in line positioning element 102 catches against the end 98 or the switching member 92.

Since there are four (4) positioning elements 102 and four (4) positioning elements 104, each of the positioning elements 102 is spaced 90 degrees from its next to adjacent positioning elements 102 and is spaced 45 degrees from its next to adjacent positioning elements 104. Likewise the positioning elements 104 are spaced 90 degrees with respect to one another and 45 degrees with respect to their nearest neighbor positioning elements 102. It is evident then when the switching member 92 moves to the right, that it moves from the position seen in FIG. 9 to the position seen in FIG. 10, the positioning drum 66 will rotate 45 degrees and when the end 98 of the switching member 92 moves back to the left, that is in moving from FIG. 10 to FIG. 9, the positioning drum 66 will move a further 45 degrees. Each complete cycle of the switching member 92, therefore, in moving first to the right and then back to the left, results in rotation of the positioning drum 66 through 90 degrees.

During normal operation of the toy 20, as noted above, the motor 28 is continuously on. This rotates the spur gear 76 via the gear train 56, 58, 60, and 76. Rotation of the spur gear 76 is ultimately communicated to the flywheel 84 via interaction of the projection 100 against the flywheel member 86. Thus, the flywheel 84 is rotating in unison with the spur gear 76 at the same speed of rotation. If the motor 28 is momentarily deaccelerated upon receipt of a radio signal by the radio receiver 26, the stopping or slowing of the motor 28 also stops or slows the rotation of the spur gear 76. However, since the flywheel 84 is independently mounted about the shaft 72 with respect to the spur gear 76, the flywheel 84 continues to independently rotate. When the flywheel 84 is rotating and the spur gear 76 is not, or if the flywheel 84 is rotating at a faster speed than the spur gear 76, the flywheel 84 moves axially to the right. That is, it moves from the position seen in FIG. 9 to the position seen in FIG. 10, and in so doing, switches the switch member 92 from engagement with the postioning elements 102 to engagement with the positioning elements 104.

When the motor 28 is accelerated upon termination of receipt of the transmitted radio signal, the spur gear 76 is also accelerated. The speed of rotation of the spur gear 76 becomes faster than the speed of rotation of the flywheel 84 which positions the helical surface 78 with respect to the flywheel member 86 such that the flywheel 84 can be moved axially to the left by the spring 88. That is, move from the position seen in FIG. 10 to the position seen in FIG. 9. This then switches the switching member 92 from its position where it has engaged a position element 104 to a position where it can engage a positioning element 102.

The end result of the above motion is that each time the motor 28 is momentarily halted, or deaccelerated, the switching member 92 moves to the right, and then upon reacceleration of the motor 28, the switching member 92 moves to the left. This ultimately rotates the positioning drum 66 ninety degrees.

The positioning drum 66 carries two planetary gears on its left hand side as seen in FIG. 9. These are planetary gears 106 and 108. Each of the planetary gears 106 and 108 mesh with the sun gear 62 and are therefore rotated by the sun gear 62. Each of the planetary gears 106 and 108, however, are journalled to the positioning drum 66 and, thus, each time the positioning drum 66 is rotated about the shaft 64, the planetary gears 106 and 108 reposition themselves by orbiting about the shaft 64. The planetary gears 106 and 108, therefore, orbit around the shaft 64 as a result of rotation of the positioning drum 66 around the shaft 64, but, also, rotate on the surface of the positioning drum 66 in conjunction with the rotation of the sun gear 62.

Each time the switching member 92 moves from one of the positioning elements 102 to the adjacent positioning element 104 and then back to the next positioning element 102, the planetary gears 106 and 108 move through 90 degrees in their orbit about the shaft 64. Thus, each of these gears 106 and 108 have four positions with respect to their location on the shaft 64, as is best seen in FIG. 6. In FIG. 6, planetary gear 108 is in approximately the eight o'clock position with planetary gear 106 in approximately the four o'clock position. Upon 90 degrees counterclockwise rotation of the position drum 66, the planetary gear 108 would be in the four o'clock position, and the planetary gear 106 would be moved to the two o'clock position. A further 90 degrees rotation would relocate the planetary gear 106 in the ten o'clock position and th planetary gear 108 in the two o'clock position. And, finally, the fourth 90 degree rotation would locate the planetary gear 106 in the eight o'clock position, and the planetary gear 108 in the ten o'clock position. Because of this, the planetary gears 106 and 108 can serve as switching gears to switch the output of the motor 28 to several gear trains as are explained below.

The gear trains shown in FIGS. 5 and 6 are utilized to concurrently drive both the left and right drive wheels 40 and 42 in a counterclockwise or forward direction as seen in FIG. 6. When the planetary gears 106 and 108 are in the position seen in FIG. 6, the planetary gear 108 is positioned so as to simultaneously connect to two indenpendent gear trains, one which leads to the left drive wheel 40, and one which leads to the right drive wheel 42.

A shaft 110 is located forward and below shaft 64. Shaft 110 has a pinon 112 which is fixed to the shaft 110 so as to rotate in conjunction with the shaft 110. Also fixed to shaft 110 so as to rotate in conjunction with shaft 110, is a spur gear 114. Because of this, spur gear 114 and pinon 112 rotate in conjunction with one another.

Mounted on shaft 110 inbetween the pinon 112 and the spur gear 114 is a further gear which includes a spur gear 116 and a pinon 118. These, however, are free to rotate independently of the shaft 110 and any other gears located thereon. To the left of spur gear 114 is a combination gear which includes a spur gear 120 and a pinon 122 which are formed together as an integral unit. The spur gear 120 and pinon 122 thus rotate as an integral unit with one another, but are free to rotate independent of any other gears on the shaft 110.

Both spur gear 120 and spur gear 114 mesh with planetary gear 108 when the planetary gear 108 is in approximately the eight o'clock position. Note that the planetary gear 108 is positioned so as to be adjacent to the crown gear 58. This location positions it so it can simultaneously engage both the spur gears 114 and 120

A further shaft 124 is positioned in front of and below shaft 110. Shaft 124 carries several gears located thereon, some of which are fixed to the shaft and some which are free to rotate independent of the shaft. Pinon 126 is fixed to the shaft 124. Pinon 126 meshes with spur gear 116. Pinon 118, which rotates in conjunction with spur gear 116, rotates a spur gear 127. Spur gear 127 is integrally formed with a knurled drum 129. Both of these are free to rotate on shaft 124. A spring arm 131 contacts drum 129 and emits a noise as the drum 129 rotates against it.

Also fixed to shaft 124 is a spur gear 128. Spur gear 128 meshes with, and is rotated by, pinon 112. Since spur gear 128 is fixed to the shaft 124, its rotation rotates pinon 126. On the surface of spur gear 124 is a re-entrant gear 130 which meshes with a like re-entrant gear 132 formed as a part of a pinon 134. A bushing 136 is fixed to one of the ends of shaft 124, and a compression spring 138 positioned between the bushing 136 and pinon 134 biases pinon 134 and reentrant gear 132 attached thereto such that a clutch is formed between the spur gear 128 and the pinon 134. This allows for propogation of motion from spur gear 128 to pinon 134, but slippage of these two gears with respect to one another if for any reason one is held fixed and the other is rotated.

Formed on the inside of drive wheel 40 is a large spur gear 140. The spur gear 140 meshes with pinon 134 and, thus, is rotated by it.

The other drive wheel 142 is driven as follows: the pinon 122 meshes with a spur gear 142 which is connected via a re-entrant gear similar to gears 130 and 132, but not numbered for simplicity of the drawings, to a pinon 144. The pinon 144 drives a spur gear 146 which integrally formed with wheel 42. Both wheels 40 and 42 and their associated spur gears 140 and 146 are independently mounted on axle 148, and, thus, can rotate independent of each other. When the main housing 22 is to be moved in a forward direction, the above described gear trains, through the spur gears 114 and 120, drive both the wheels 40 and 42 in the same direction. For turning purposes, however, the wheels 40 and 42 are driven in opposite directions.

The gear trains for causing rotation of the main housing 22 by driving the drive wheels 40 and 42 in opposite directions is shown in FIG. 7. In this FIG. 7, planetary gear 108 has moved through three successive positions from that seen in FIG. 6, until it is located in approximately the ten o'clock position. As explained before, this positions the planetary gear 106 in the approximate eight o'clock position. In the ten o'clock position, the planetary gear 108 meshes with spur gear 150 which is freely mounted on a shaft 152 which is placed forward and upward from the shaft 64. The spur gear 150, in turn, meshes with spur gear 120. This effectively interspaces an additional gear, gear 150, in the gear train between the gears 108 and the drive wheel 42. This, thus, reverses the direction of the drive wheel compared to forward movement seen in FIG. 5.

The gear 106, as seen in FIG. 7, however, directly meshes with spur gear 114 as did the gear 108 for forward movement of the toy as seen in FIG. 5. This establishes the same type of gear train to the drive wheel 40 as was shown in FIG. 5, and as such, the wheel 40 rotates the same as it did in FIG. 5. Since the wheel 40 is rotating in one direction and the wheel 42 is rotating in the opposite direction, the main housing 22 will now spin about a vertical axis through continuous 360 degree rotations as long as the gear trains shown in FIG. 7 are utilized.

For a further of the modes, the stopping mode, the positioning drum 66 is rotated so as to locate the planetary gear 106 in aproximately the two o'clock position, and planetary gear 108 in approximately the four o'clock position such that neither one of these gears interact with any other gear. This effectively severs all propogation of rotation of the motor 28 to any further gears such that movement of the main housing 22 ceases, even though the motor 28 continues to rotate.

FIG. 8 shows the fourth mode, the missile projecting mode. Shaft 152 also carries on it a spur gear 154 which is fixed to shaft 152. Also fixed to the shaft 152 is a pinon 156. A gear train from pinon 156 through combination gears 158, 160, and, finally, to gear 162, is established. Each of these gears are appropriately mounted within the internal housing 38.

As can be seen in FIG. 8, and further seen in FIG. 12, four vanes collectively identified by the numeral 164, are formed on the side of gear 162. Positioned above and somewhat forward of the gear 162, is a lever 166. Lever 166 is pivoted about axle 168. Gear 162 and the vanes 164 attached thereto, are rotated clockwise as seen in FIG. 12. Because of this, the vanes 164 engage the bottom of lever 166 so as to rotate this lever counterclockwise from the position seen in solid line to the position seen in phantom line of FIG. 12. Upon full counterclockwise rotation of the lever 166, the vanes 164 slide free of the bottom of the lever 166, allowing it, as hereinafter explained, to return from the phantom line position to the solid line position.

Positioned just above and forward of lever 166 is a further lever 170. Lever 170 is mounted about an axle 172 and, also, mounted about the axle 172 is a hairpin spring 174. The hairpin spring 174 engages the internal housing 38 and the top of lever 174 so as to bias the lever 170 counterclockwise as seen in FIGS. 12 and 13. When the upper end of lever 166 contacts the lower end of lever 170, the lever 170 is rotated counterclockwise to induce a bias into the hairpin spring 174. When the vanes 164 slip underneath the bottom end of the lever 166 upon full counterclockwise rotation of this lever, this allows the bias introduced into hairpin spring 174, to rotate the lever 170 counterclockwise from the position seen in phantom line FIG. 12 to the position seen in solid line FIG. 12, which in turn rotates the lever 166 clockwise to the position shown in solid line FIG. 12.

An opening 176 is formed in the top of the shell 36 of the main housing 22. The opening 176 feeds into a tube 178 formed in the internal housing 38. Projecting forward from the bottom end of tube 178 is a flat tube 180 which serves as a muzzle leading to the mouth 32 of the shell 36. A plurality of projectiles collectively identified by the numeral 182 shaped as flat disks, are fed through the opening 176 into the tube 178 and stacked therein as is seen in FIG. 12. Upon each counterclockwise rotation of the lever 170 under the bias of the spring 174, the top of the lever 170 can contact the lower most disk 182 to propel it forward out of the flat tube 180 and out of the mouth 32 of the main housing 22 of the toy 20.

There is an appropriate longitudinally extending slot 184 formed in the bottommost part of the tube 178 allowing for movement of the lever 170 through the bottom of the tube 178 in order for it to contact the lowermost disk 182 so as to propel this disk forward under the bias of the spring 174. The vertical dimension of the tube 180 is insufficient to allow more than one disk at a time to be projected through it, and the position of the top of the lever 170 is such that it only contacts the lowermost disks located in the tube 178. As such, only one disk at a time is given any forward momentum and propelled out of the main housing 22.

The motion for propelling the disk 182 out of the tube 180 is ultimately communicated via the gear train consisting of planetary gear 106 interacting with spur gear 154. This happens when the planetary gear 106 is approximately in the ten o'clock position. At this time, the planetary gear 108 is approximately in the two o'clock position and does not interact with any other gears. The planetary gears 106 and 108 are spaced with respect to the spacing of the spur gears 154 and 150 such that planetary gear 106 can only contact spur gear 154, and planetary gear 108 can only contact spur gear 150. This, thus, isolates the turning motion of the main housing 22 from the projectile motion.

If the toy 20 is initially turned on when it is in the projectile mode (that is when the planetary gear 106 is in mesh with the spur gear 154), as noted above, the planetary gear 106 is approximately in the ten o'clock position and the planetary gear 108 is approximately in the two o'clock position. On receipt of the next transmitted radio signal, the positioning drum 66 rotates 90 degrees to position the planetary gear 106 in approximately the eight o'clock position, and the planetary gear 108 in approximately the ten o'clock position to switch the toy to the turning mode. Receipt of a further radio signal repositions the planetary gear 106 to the approximately four o'clock position, and the planetary gear 108 to approximately the eight o'clock position to engage it with the spur gears 114 and 120 to switch the toy 20 into the forward mode. Receipt of the next transmitted radio signal positions the planetary gear 106 in the two o'clock position, and the planetary gear 108 in approximately the four o'clock position such that no gear trains are established and the toy 20 is in the stop mode. The next radio signal results in a further 90 degree rotation of the positioning drum 66 to position the toy 20 once again in the projectile mode.

It is evident that the toy 20 can execute four (4) different modes because of the ultimate switching effect of the positioning drum 66 each time the flywheel 84 accelerates and then deaccelerates with respect to rotation of the spur gear 76 which is rotated directly by the motor 28. Thus, a multiplicity of modes of action can be achieved by utilizing a very simple radio transmitter and receiver which does nothing more than momentarily switch the power to the motor 28 off and then back on. It is evident that by incorporating further gear trains and further positioning elements 102 and 104 on a positioning drum, such as positioning drum 66, that additional modes of movement could be incorporated into the toy 20.

I claim:

1. A toy which comprises:

a housing;

a motor mounted on said housing, said motor producing a rotational output in a constant direction to move portions of said toy;

motor control means mounted on said housing in operative association with said motor, said motor control means being for controlling said motor by accelerating and decelerating said motor;

a flywheel rotatably mounted on said housing;

motion transfer means located on said housing in operative association with said flywheel and said motor for transferring rotation of said motor to said flywheel whereby said flywheel can be rotated by said motor;

switch means mounted on said housing in operative association with said flywheel said switch means including a switching member mounted to said housing for movement from at least a first position to a second position with respect to said housing, means including said flywheel for moving said switching member from one to the other of said positions and back again, respectively, in response to acceleration and deceleration of said motion transfer means with respect to said flywheel;

output means mounted on said housing in operative association with said motor whereby said motor drives said output means, said output means being capable of outputting a selected one of at least two independent outputs, said output means further operatively associated with said switch means whereby said output means outputs one of its outputs in response to said switching member being in one of said positions and said output means outputs a further of its outputs in response to said switching member being in the other position;

said switch means including at least one switch gear operatively associated with said motor so as to be rotated by said motor;

said switch means further including a positioning member rotatably mounted on said housing for changing the position of said switch gear relative to said motor, said switch gear being eccentrically mounted on said positioning member so as to rotate in association with said positioning member whereby it can move from a position effecting its use in one of said outputs to another position effecting its use in another of said outputs.

2. The toy of claim 1 wherein:

said switching member being moveably mounted on said housing in operative association with both said flywheel and said positioning means, said flywheel moving said switching member on said housing, said switching member, in moving on said housing, interacting with said positioning member so as to position said positioning member in a plurality of positions on said housing and said positioning means, in turn, positioning said switch gear in a like number of positions on said housing.

3. The toy of claim 2 wherein:

said positioning member includes a plurality of positioning elements located on said positioning member, at least two of said positioning elements located axially with respect to each other on said positioning member, and at least two of said positioning elements located circumferentially with respect to each other on said positioning member.

4. The toy of claim 2 wherein:

said output means including gear train means for transferring rotational motion, said gear train means having at least two output gears, each of said output gears independently opertively associated with said motor and rotated by said motor in response to said switching member being in one of said respective positions;

said switch gear meshing with at least one of said output gears in each of said positions of said switch gear, said switch gear transferring rotation to any of said output gears in mesh with said switch gear to rotate said respective output gear.

5. A toy which comprises:

a housing;

a motor mounted on said housing, said motor producing a rotational output in a constant direction to move portions of said toy;

motor control means mounted on said housing in operative association with said motor, said motor control means being for controlling said motor by accelerating and decelerating said motor;

a flywheel rotatably mounted on said housing;

motion transfer means located on said housing in operative association with said flywheel and said motor for transferring rotation of said motor to said flywheel whereby said flywheel can be rotated by said motor;

switch means mounted on said housing in operative association with said flywheel, said switch means including a switching member mounted to said housing for movement from at least a first position to a second position with respect to said housing, means including said flywheel for moving said switching member from one to the other of said positions and back again, respectively, in response to acceleration and deceleration of said motion transfer means with respect to said flywheel;

output means mounted on said housing in operative association with said motor whereby said motor drives said output means, said output means being capable of outputting a selected one of at least two independent outputs, said output means further operatively associated with said switch means whereby said output means outputs one of its outputs in response to said switching member being in one of said positions and said output means outputs a further of its outputs in response to said switching member being in the other position;

said motion transfer means including a rotating element, said rotating element being rotatably mounted on said housing in association with said flywheel, said rotating element being operatively connected to said motor so as to be rotated by said motor;

said motion transfer means further including a connecting means for operatively connecting said flywheel to said rotating element for rotating said flywheel;

a shaft, said shaft mounted on said housing;

said rotating element and said flywheel being mounted on said shaft and independently rotatable with respect to each other;

said connecting means including a helical surface fixed to said rotating element and helically extending along the axis of rotation of said shaft towards said flywheel, said connecting means further including an engagement member axially extending from said flywheel towards said helical surface so as to contact said helical surface;

said flywheel axially moving along said shaft in response to movement of said engagement member on said helical surface.

* * * * *

UNITED STATES PATENT AND TRADEMARK OFFICE
CERTIFICATE OF CORRECTION

PATENT NO. : 4,623,320

DATED : Nov. 18, 1986

INVENTOR(S) : KATSUMI KAKIZAKI AND YUTAKA AJIRO

It is certified that error appears in the above-identified patent and that said Letters Patent is hereby corrected as shown below:

In the Abstract, lines 3, 13 and 14, Column 2, lines 4 and 16, Column 4, line 31, Column 7, the word spanning lines 54 and 55, Column 8, line 14 and Column 11, line 63, "deaccelerating" should read --decelerating--.

Column 1, line 25, the " . " should read as a -- , --.

Column 2, the word spanning lines 11 and 12, "associated" should read --association--.

Column 2, line 15, "response" should read --response to--.

Column 3, line 12, "toy" should read --toy of the invention--.

Column 3, line 46, "region" should read --reason--.

Column 4, line 36, "rotation" should read --rotating--.

Column 6, line 43, "88" should read --82--.

Column 7, line 28, "or" should read --of--.

Column 8, line 8, "88" should read --82--.

Column 8, line 11, the first occurrence of "position" should read --positioning--.

Column 8, line 48, "th" should read --the--.

UNITED STATES PATENT AND TRADEMARK OFFICE
CERTIFICATE OF CORRECTION

PATENT NO. : 4,523,320

DATED : Nov. 18, 1986

INVENTOR(S) : KATSUMI KAKIZAKI AND YUTAKA AJIRO

It is certified that error appears in the above-identified patent and that said Letters Patent is hereby corrected as shown below:

```
Column 8, line 62, "indenpendent" should read
--independent--.
    Column 9, line 52, "which" should read --which is--.
    Column 9, line 59, delete the word "the".
    Column 10, line 55, "174" should read --170--.
    Column 11, line 21, "disks" should read --disk--.
```

Signed and Sealed this

Twenty-eighth Day of April, 1987

*Attest:*

DONALD J. QUIGG

*Attesting Officer*     *Commissioner of Patents and Trademarks*